(12) United States Patent
He et al.

(10) Patent No.: US 9,082,493 B2
(45) Date of Patent: Jul. 14, 2015

(54) ADAPTIVE ERASE METHODS FOR NON-VOLATILE MEMORY

(71) Applicants: Chen He, Austin, TX (US); Fuchen Mu, Austin, TX (US); Yanzhuo Wang, Austin, TX (US)

(72) Inventors: Chen He, Austin, TX (US); Fuchen Mu, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 104 days.

(21) Appl. No.: 14/069,195

(22) Filed: Oct. 31, 2013

(65) Prior Publication Data
US 2015/0117112 A1    Apr. 30, 2015

(51) Int. Cl.
| | |
|---|---|
| *G11C 11/34* | (2006.01) |
| *G11C 16/16* | (2006.01) |
| *G11C 16/34* | (2006.01) |
| *G11C 16/14* | (2006.01) |
| *G11C 11/56* | (2006.01) |

(52) U.S. Cl.
CPC ............ *G11C 16/16* (2013.01); *G11C 16/3445* (2013.01); *G11C 11/5635* (2013.01); *G11C 16/14* (2013.01)

(58) Field of Classification Search
CPC .... G11C 16/16; G11C 11/5635; G11C 16/14; G11C 16/3468; G11C 2216/18; G06F 12/0246; G06F 3/0652
USPC ............ 365/185.03, 185.11, 185.17, 185.18, 365/185.22, 185.24, 185.29, 185.3
See application file for complete search history.

(56) References Cited

U.S. PATENT DOCUMENTS

| | | | |
|---|---|---|---|
| 6,055,184 A | 4/2000 | Acharya et al. | |
| 7,116,584 B2 | 10/2006 | Gatzemeier et al. | |
| 8,432,752 B2 | 4/2013 | Eguchi et al. | |
| 8,509,001 B2 | 8/2013 | He et al. | |
| 8,972,652 B2 * | 3/2015 | Kim et al. ..................... | 711/103 |
| 2013/0179728 A1 * | 7/2013 | Zhou ............................... | 714/15 |
| 2014/0198575 A1 * | 7/2014 | Dutta et al. .............. | 365/185.17 |
| 2014/0247667 A1 * | 9/2014 | Dutta et al. .............. | 365/185.22 |

OTHER PUBLICATIONS

U.S. Appl. No. 13/787,799, Eguchi, R.K. et al, "Temperature-Based Adaptive Erase or Program Parallelism", filed Mar. 6, 2013.

* cited by examiner

*Primary Examiner* — Fernando Hidalgo (57) ABSTRACT

A method includes an erase of a plurality of blocks of memory cells in which the memory cells within a block are simultaneously erased. The erase of each block of the plurality of blocks is performed using an erase pulse applied multiple times. The erase pulse is applied to the plurality of blocks in parallel. An erase verify is performed after each application of the erase pulse. After a number applications of the erase pulse, it is determined if a condition comprising one of a group consisting of any memory cell has been more erased than a first predetermined amount and any memory cell has been erased less than a second predetermined amount has been met. If the condition has been met, erasing is continued by applying the erase pulse to the block having the memory cell with the condition independently of the other blocks of the plurality of blocks.

19 Claims, 6 Drawing Sheets

ADAPTIVE ERASE METHODS FOR NON-VOLATILE MEMORY

BACKGROUND

1. Field of the Disclosure

The present disclosure relates in general to non-volatile memories, and more specifically to a system and method for adaptively erasing non-volatile memory.

2. Description of the Related Art

During a typical erase operation of a non-volatile memory (NVM) block, such as erasable programmable read only memories (EPROMs), electrically erasable programmable read only memories (EEPROMs), block erasable EEPROMs (e.g., "Flash" memories), etc., a pre-program procedure is first performed to raise the threshold voltages of the memory cells of the memory block to a level at or above a program verify voltage. For the erase operation, the pre-program procedure is followed by a Fowler-Nordheim (FN) erase procedure to lower the threshold voltages of the memory cells of the memory block to a level at or below an erase verify voltage. During the conventional FN erase procedure, however, the resulting distribution may include memory cells which have been over erased, which results in increased column leakage. Furthermore, the problem of column leakage increases as the memory cells are further scaled, causing, for example, a subsequent program procedure to fail due to lowered drain bias, or a read procedure to fail since the over-erased memory cells may prevent sense amplifiers from distinguishing between an erased cell and a programmed cell. A soft program procedure may be used after the FN erase procedure to compress the distribution of the erased cells so as to reduce the column leakage.

A memory device is typically addressed by blocks of one or more different sizes. The FN erase procedure may be performed serially on one block at a time, or in parallel on several blocks simultaneously. For small blocks (e.g., blocks with 64 Kbytes or less), the erase operation time is dominated by the FN erase procedure. For large blocks (e.g., blocks with 128 Kbytes or more), the erase operation time is dominated by the soft program procedure. To speed up the erase operation for multiple blocks, if the blocks are always erased in parallel during the FN erase step, there is a risk that the number of over-erased bits will increase resulting in an increase in the amount of time required to soft program, potentially increasing the overall time required for the total erase operation time. However, if selected blocks are always serially erased in the FN erase step, an unnecessarily longer erase time will be required, especially when erasing small blocks.

BRIEF DESCRIPTION OF THE DRAWINGS

The benefits, features, and advantages of the present disclosure will become better understood with regard to the following description, and accompanying drawings where.

DETAILED DESCRIPTION

The following description is presented to enable one of ordinary skill in the art to make and use the present disclosure as provided within the context of a particular application and its requirements. Various modifications to the preferred embodiment will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Systems and methods are disclosed that optimize the time required to perform erase operations when memory blocks of different sizes are selected for FN erase followed by soft program to reduce memory device leakage due to over-erased cells resulted from the FN erase procedures. A memory controller or other suitable logic determines whether to perform parallel erase of the blocks or serial erase of the blocks during the FN erase procedure. The decision of whether parallel or serial erase is performed can be based on the size of selected block and the threshold voltage movement of the bits in the selected blocks. The blocks selected for the erase operation may be sorted into clusters of blocks having a predetermined size. Serial FN erase procedure can be used across the different clusters, while the parallel FN erase procedure can be used on the blocks within each cluster. Within each cluster, the threshold voltage movement of the bits in the cluster will be checked to determine if parallel FN erase can continue or switch to serial FN erase on the blocks within each cluster. Adaptively selecting between parallel and serial FN erase procedures within a cluster improves FN erase time without incurring a time penalty for the following soft program procedure and hence improving the total erase operation time.

Figure 1:
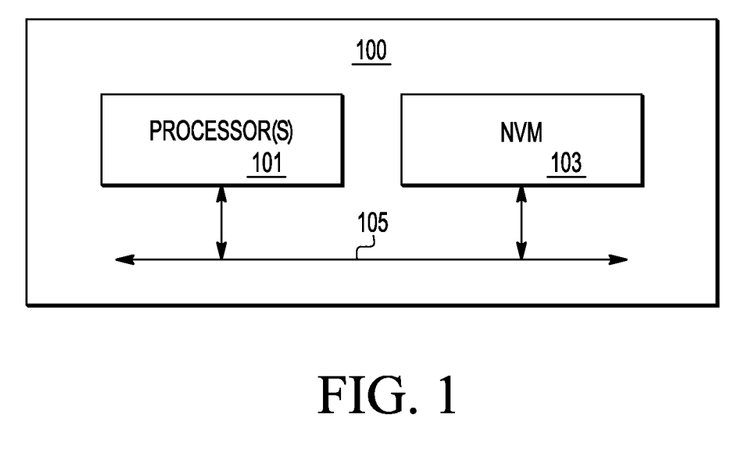
FIG. 1 is a block diagram of an integrated circuit including a non-volatile memory (NVM) according to one embodiment.

FIG. 1 is a block diagram of an integrated circuit 100 including a non-volatile memory (NVM) 103 according to one embodiment. In the illustrated embodiment, the integrated circuit (IC) 100 may implement a System On Chip (SOC) or the like which includes at least one processor 101 coupled to the NVM 103 via an appropriate interface 105, such as a bus or the like with multiple signals or bits. The IC 100 may include other circuits, modules or devices, such as other memory devices (not shown), other functional modules (not shown), and external interfaces, such as input, output or input/output (I/O) ports or pins or the like (not shown). In one alternative embodiment, the NVM 103 is integrated on the IC 100 alone without any other devices. In another alternative embodiment, the processor 101, NVM 103 and interface 105 are part of a larger system on the IC 100.

Figure 2:
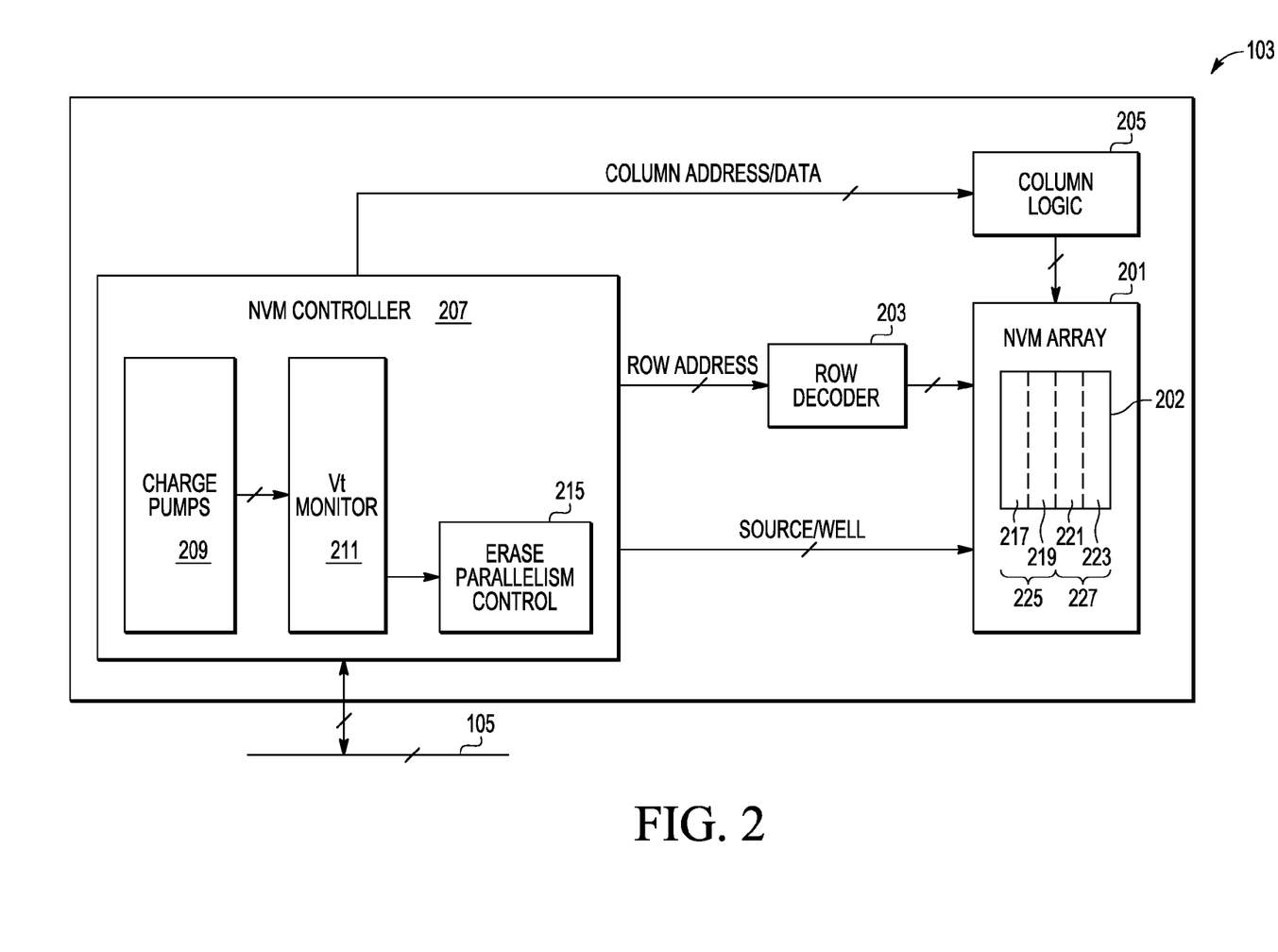
FIG. 2 is a more detailed block diagram of the NVM according to one embodiment coupled to the interface of FIG. 1.

FIG. 2 is a more detailed block diagram of the NVM 103 according to one embodiment coupled to the interface 105. The NVM 103 includes an NVM array 201, a row decoder 203 coupled to the NVM array 201, column logic 205 coupled to the NVM array 201, and a NVM controller 207 coupled to the interface 105, the NVM array 201, the column logic 205, and the row decoder 203. The column logic 205 incorporates a column decoder and sense amplifiers (not shown) and each interface is shown with multiple signals or bits. The NVM controller 207 controls program and erase procedures of the NVM array 201 through the row decoder 203 and the column logic 205, such as in response to the processor(s) 101 as communicated through the interface 105 or other interfaces. The NVM controller 207 accesses memory cells within the NVM array 201 by providing a row address to the row decoder 203 and a column address to the column logic 205. Data is written into or read from the NVM array 201 via the column logic 205. The NVM controller 207 also drives source and well voltages (via corresponding switches and controllers, not shown) to the NVM array 201.

Shown within NVM controller 207 are charge pumps 209, threshold voltage (Vt) monitor 211, and erase parallelism control logic 215. Charge pumps 209 can include a negative charge pump that provides erase gate voltage, a positive charge pump that provides program gate voltage and erase well voltage, and a drain pump that provides program drain voltage, to the cells in NVM array 201. The charge pumps 209 also provide the verify gate voltage to Vt monitor 211. The Vt monitor 211 provides indicators of whether parallel or serial FN erase can be performed to erase parallelism control logic 215. Erase parallelism control logic 215 partitions the selected blocks in the memory array 201 into clusters of predetermined size, and then use the indicators from Vt monitor 211 to determine the blocks in each cluster to be FN erased serially or in parallel, as further described herein in the description of FIG. 3.

The NVM array 201 incorporates one or more blocks of memory cells in which each memory block has a selected block size, such as, for example, 16 kilobytes (kB), 32 kB, 64 kB, 128 kB, 256 kB, etc. Memory cells in NVM array 201 typically have a gate (G) terminal, a drain (D) terminal and a source (S) terminal along with isolated wells including a pwell (PW) and an nwell (NW). In one embodiment, each memory block is organized into rows and columns of the memory cells. The gate terminal of each row of memory cells is coupled to a corresponding one of multiple wordlines coupled to the row decoder 203. The drain terminal of each column of memory cells is coupled to a corresponding one of multiple bit lines coupled to the column logic 205. The source terminal and wells (PW and NW) of each memory cell are driven or controlled by the NVM controller 207.

As shown, the NVM array 201 includes at least one memory cell array 202 that is configured to allow erase procedures to be performed serially or in parallel. For instance, the memory array 202 is configured to allow a serial or parallel erase procedure to be performed on all the blocks, or a combination of serial and parallel erase procedures on groups of blocks. Memory array 202 is shown with dashed lines for clusters 225, 227 each including a portion of the memory blocks 217, 219, 221, 223 in memory array 202.

When erasing multiple blocks, for instance, blocks 217-223, NVM controller 207 can partition the NVM blocks 217-223 selected for erase into clusters 225, 227, and adaptively enable FN parallel or serial erase based on the movement of the threshold voltage (Vt) of bits during FN erase step within the cluster. Parallel FN erase can initially be used by default within each cluster. The cluster size is predetermined for each particular NVM technology. For instance, typical cluster size can be 256 Kbytes or 512 Kbytes. The threshold voltage (Vt) of the bits in the cluster can be checked during parallel FN erase after a predetermined number of erase pulses, i.e., reaching an interim erase pulse count. If the threshold voltage of any bit in the cluster is lower than a predetermined limit (indicating existence of fast erase bits), or if the threshold voltage of any bit is higher than another predetermined limit (indicating existence of slow erase bits), the controller 207 can switch to serial FN erase of the blocks in the cluster. Otherwise parallel FN erase of the blocks in the cluster continues. Such adaptive FN erase of the blocks within a cluster will be done for one cluster at a time until all clusters have completed FN erase.

The memory cells in memory array 201 can be implemented according to any one of several configurations, such as semiconductor configurations, layered silicon-metal nano crystals, etc. In one embodiment, each memory cell is implemented on a silicon substrate or the like. In one embodiment, the pwell of each memory cell is isolated from a P substrate with the nwell. A pair of n+ type doped regions (not shown) are formed in the pwell forming the drain and source terminals of each memory cell. Each memory cell further includes a stacked gate structure or the like, including an oxide layer (not shown) formed on the pwell, a floating gate (not shown) provided on the oxide layer, a dielectric layer (not shown) provided on the floating gate, and a control gate (not shown) provided on the dielectric layer forming a gate terminal. The pwell is generally coupled to a ground voltage Vss and the nwell is generally coupled to a source voltage Vdd except during FN erase pulses as described herein. The voltage level of Vdd and duration of pulses depends upon the particular implementation.

Figure 3:
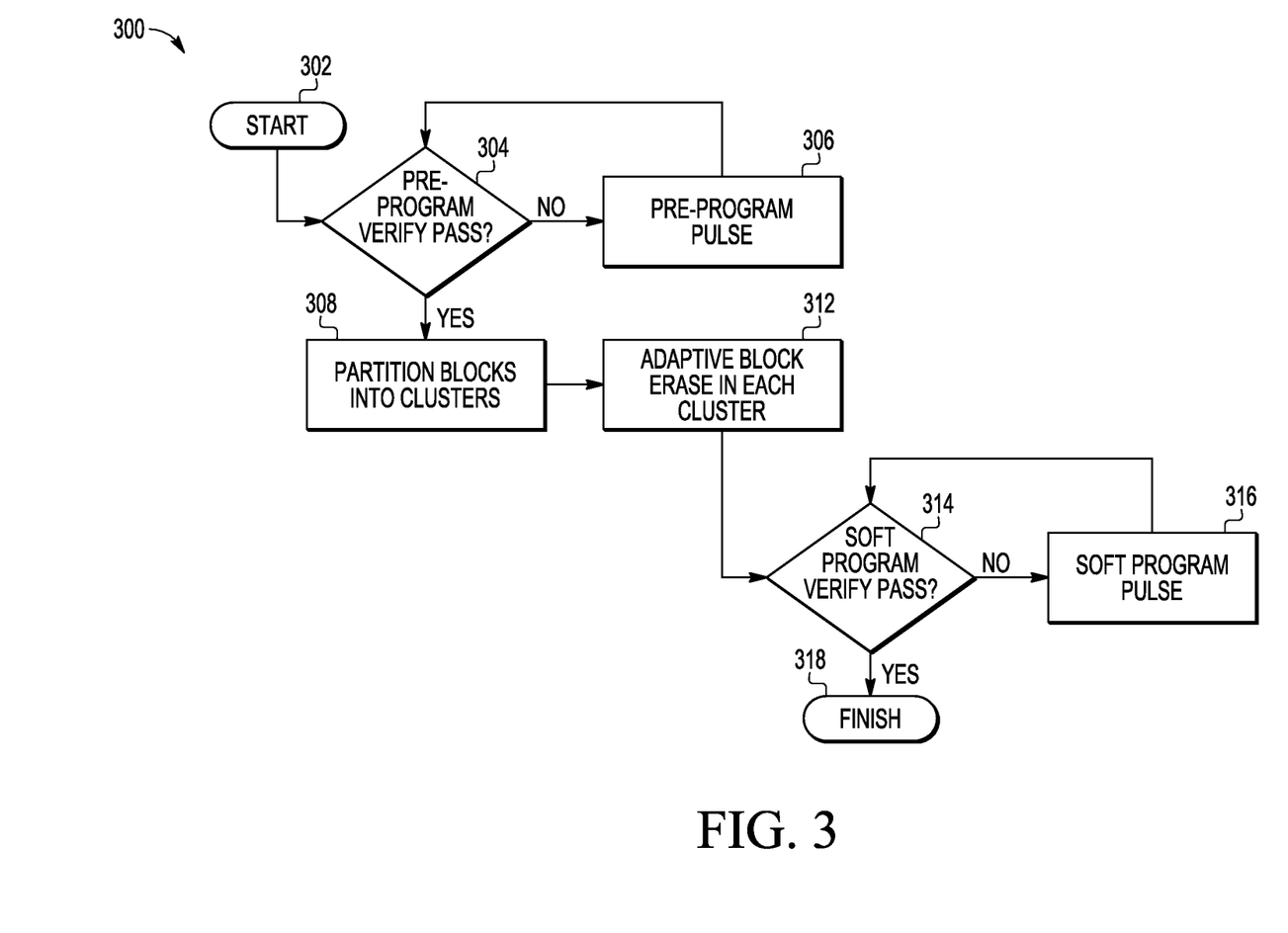
FIG. 3 is a flowchart diagram of an erase operation generally controlled by the NVM controller of FIG. 2 in accordance with one embodiment for the selected memory blocks within the NVM array of FIG. 2.

FIG. 3 is a flowchart diagram of an erase operation 300 generally performed by the NVM controller 207 of FIG. 2 in accordance with one embodiment for the memory blocks 217-223 within the NVM array 201 of FIG. 2. In process 302, erase operation 300 begins by transitioning to process 304 to determine whether a pre-program verify procedure has passed. The pre-program verify operation can include determining whether a pre-program operation is required to bring the cells in selected blocks of the NVM array 201 to a pre-program level. The pre-program threshold voltage level will depend on the configuration/technology of the transistors that form the memory cells.

If the pre-program verify operation is not fully successful, process 304 determines that the pre-program verify operation has not passed and transitions to process 306. Process 306 iteratively applies one or more pre-program pulses to the cells which failed pre-program verify in the selected blocks of the NVM array 201 until process 304 determines that the pre-program verify operation is successful on all the memory cells in the selected blocks.

Once the pre-program verify operation passes, process 304 transitions to process 308 to partition the blocks selected for the erase operation into clusters. Each cluster has the same total number of bytes and may comprise two or more blocks having the same size or different sizes. One or more clusters may be formed that include block(s) that do not fit in another cluster. For example, each cluster may have a total size of 512 Kbytes, with a first cluster that includes eight 16 Kbyte blocks, and three 128 Kbyte blocks. Another cluster may include two 256 Kbyte blocks. Other cluster sizes and combinations of block sizes in a cluster can be used. If the size of the remaining blocks is less than 512 Kbytes, they can be included in a cluster with a smaller size.

Figure 4:
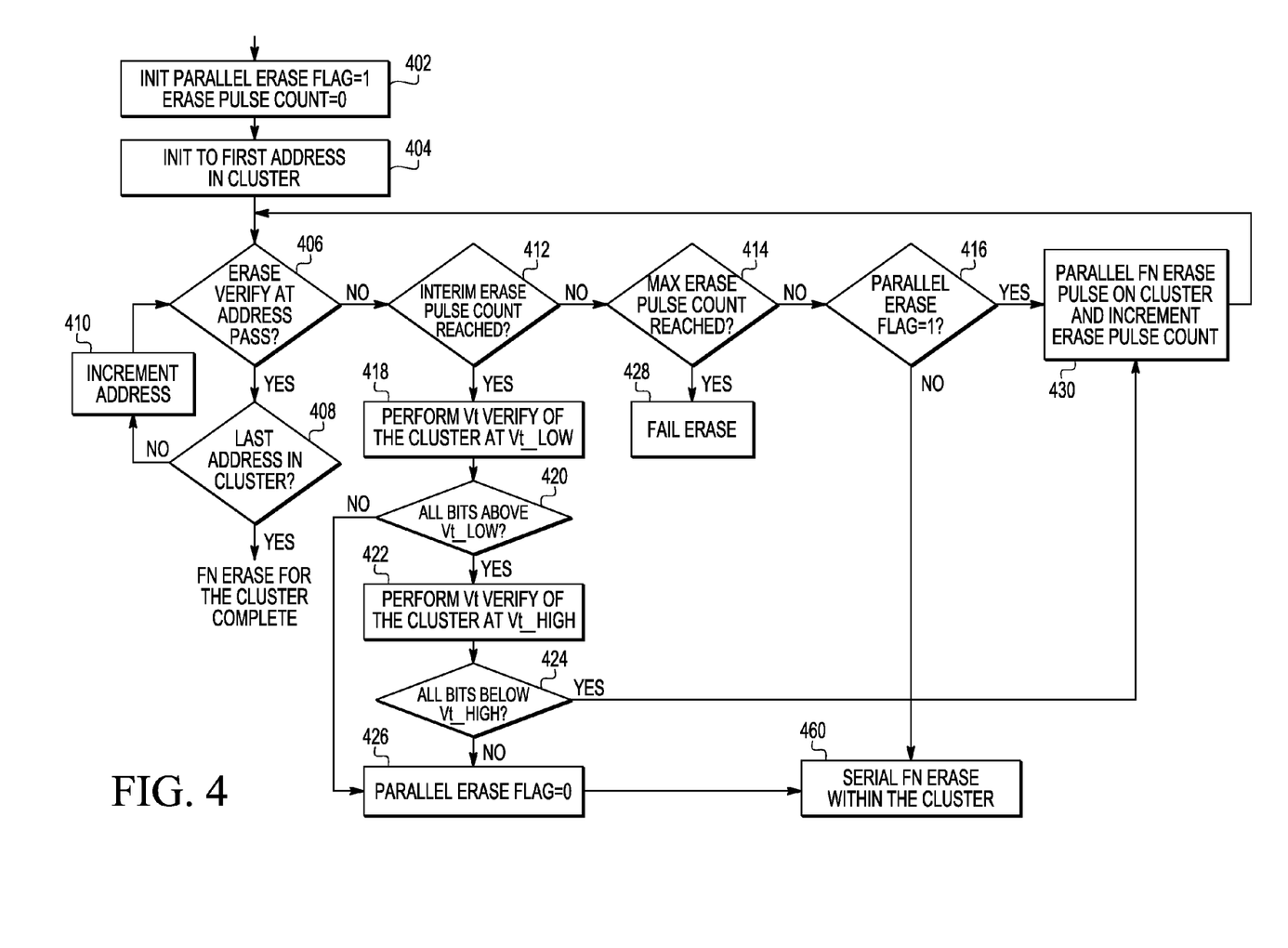
FIG. 4 is a flowchart diagram of an embodiment of a method for erasing at least a portion of the selected memory blocks generally executed and controlled by the NVM controller of FIG. 2.

Once the clusters are formed in process 308, process 312 performs an adaptive block erase procedure to erase the blocks within each cluster, as further described in FIG. 4 herein. Process 312 then transitions to process 314 to perform soft program verify and determine whether the soft program verify operation has passed or failed for the selected blocks of the NVM array 201. If the soft program operation has passed, process 314 transitions to process 318 to finish the erase operation for the selected blocks of the NVM array 201. If the soft program operation has failed, however, process 314 transitions to process 316 to apply a soft program pulse to the memory cells in the selected blocks of the NVM array 201. Process 316 then transitions back to process 314 to perform soft program verify and determine whether the memory cells now pass the soft program verify operation.

FIG. 4 is a flowchart diagram of an embodiment of process 312 for adaptively erasing a cluster of NVM blocks that can be performed by NVM controller 207 of FIG. 2. In process 402, the default erase operation is set to parallel FN erase by setting a parallel erase flag (ParallelEraseFlag) to 1, in which all the blocks in a cluster are erased simultaneously, and the erase pulse count is initialized to zero. Process 404 includes initializing the current address for the parallel FN erase operation to the first address in the cluster. Process 406 determines whether an erase verify operation passes at the current address. The erase verify operation will pass when the threshold voltage of the memory cells at the current address are at or below an erase verify voltage at which the memory cell can be considered erased. If the erase verify procedure passed in process 406, process 408 determines whether the current address is the last address in the cluster. If so, the FN erase procedure for the cluster completes and process 408 transitions to continue with a soft program operation in process 314 of FIG. 3. If not, process 408 transitions to process 410 to increment the current address and then to process 406 to determine whether erase verify passes at the new current address.

If process 406 determines that the erase verify did not pass for the current address, process 412 determines whether an interim erase pulse count has been reached. If the interim erase pulse count has not been reached, process 412 transitions to process 414 to determine whether a maximum erase pulse count has been reached. If the maximum erase pulse count has not been reached, process 414 transitions to process 416 to determine if ParallelEraseFlag is equal to 1. If yes, process 416 transitions to process 430 which applies a parallel FN erase pulse on the blocks in the cluster and increments the erase pulse count. If not, process 416 transitions to process 460 to perform serial FN erase on the blocks in the cluster, as further described herein.

Referring back to process 412, if the interim erase pulse count is reached, process 418 performs a threshold voltage verify operation to determine whether the threshold voltage level of any of the memory cells in the cluster is below a predetermined minimum or low threshold voltage (Vt_low). Process 420 checks whether the result of process 418 indicates that the threshold voltage of all the memory cells in the cluster is above the minimum threshold voltage. If the threshold voltage of all the memory cells in the cluster is not above the minimum threshold voltage, process 420 transitions to process 426 to set ParallelEraseFlag to 0, to indicate to switch to using serial FN erase operation instead of parallel FN erase operation for subsequent application of FN erase pulse(s). Then process 426 transitions to process 460 to perform serial FN erase on the blocks in the cluster.

If the threshold voltage of all the memory cells in the cluster is above the minimum threshold voltage, process 420 transitions to process 422 to determine whether the threshold voltage level of any of the memory cells in the cluster is above a predetermined maximum or high threshold voltage (Vt_high). Process 424 checks whether the result of process 422 indicates that the threshold voltage of all the memory cells in the cluster is below the maximum threshold voltage. If the threshold voltage of all the memory cells in the cluster is not below the maximum threshold voltage, process 424 transitions to process 426 to set ParallelEraseFlag to 0, to indicate to switch to using serial FN erase operation instead of parallel FN erase operation for subsequent application of FN erase pulse(s). Then process 426 transitions to process 460 to perform serial FN erase on the blocks in the cluster, as further described herein.

If process 420 determines the threshold voltage of all the memory cells in the cluster is above the minimum threshold voltage and process 424 determines the threshold voltage of all the memory cells in the cluster is below the maximum threshold voltage, then process 424 transitions to process 430 to apply a parallel FN erase pulse on the blocks in the cluster.

Referring again to process 414, if the maximum erase pulse count has been reached, process 414 transitions to process 428 to indicate that the erase operation has failed.

Figure 5:
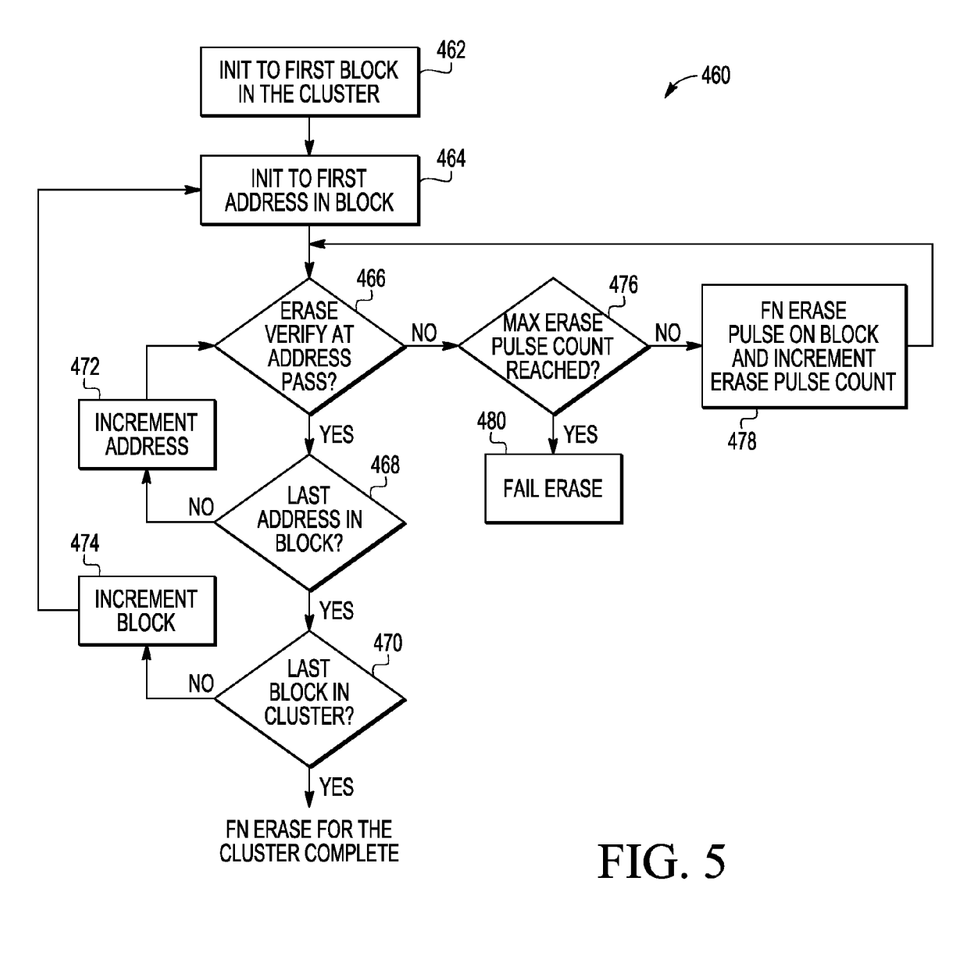
FIG. 5 is a flowchart diagram of an embodiment of a method for serially erasing the portion of the selected memory blocks in FIG. 4.

FIG. 5 is a flowchart diagram of an embodiment of process 460 for serial FN erase of the NVM blocks in a cluster. Process 460 starts with process 462 initializing the current block to the first block in the cluster, followed by process 464 which initializes the current address to the first address in the current block. Process 464 transitions to process 466 to determine whether an erase verify operation passes at the current address. If the erase verify procedure passed in process 466, process 468 determines whether the current address is the last address in the current block. If so, the FN erase procedure for the current block completes and process 468 transitions to process 470 to determine if the current block is the last block in the cluster. If not, process 468 transitions to process 472 to increment the current address and then to process 466 to determine whether erase verify passes at the new current address. If process 470 determines the current block is the last block in the cluster, the FN erase procedure for the cluster completes and process 470 transitions to continue with a soft program operation in process 314 of FIG. 3. If not, process 470 transitions to process 474 to increment the current block and then to process 464 to perform the erase verify for the new block.

If the erase verify procedure failed in process 466, the process 476 determines whether a maximum erase pulse count for the current block has been reached. If the maximum erase pulse count has not been reached, process 478 applies an FN erase pulse on the current block and increments the erase pulse count for the current block. If the maximum erase pulse count has been reached, process 476 transitions to process 480 to indicate that the erase operation has failed.

Figure 6:
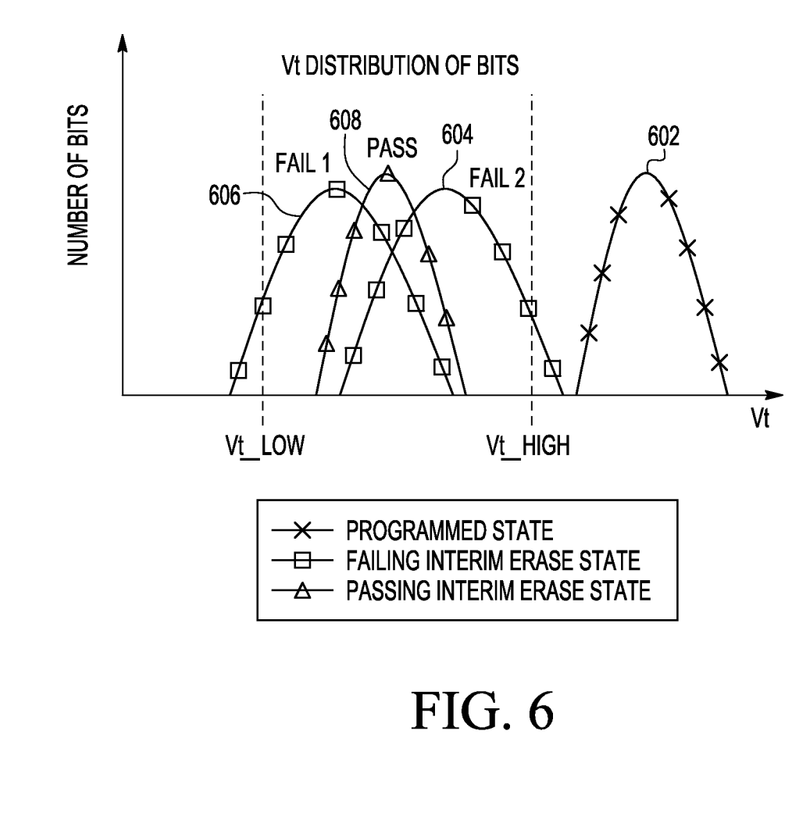
FIG. 6 is a diagram of an example of threshold voltage distribution for a cluster of memory cells in the NVM array of FIG. 2.

FIG. 6 is a diagram of an example of possible threshold voltage distributions for a cluster of memory cells in the NVM array 201 of FIG. 2 during various operational phases in an erase operation. Curve 502 shows a threshold voltage distribution of memory cells in programmed state with threshold voltages of all the memory cells above a predetermined program verify threshold voltage after the pre-program procedure. Curves 504, 506 and 508 are corresponding to different cases when the interim erase pulse count has been reached. Curve 504 shows a threshold voltage distribution of the memory cells in a first failing interim erase state where the threshold voltage of some of the bits cells is above the predetermined high threshold voltage (Vt_high). Curve 506 shows a threshold voltage distribution of the memory cells in a second failing interim erase state where the threshold voltage of some of the bits cells is below a predetermined low threshold voltage (Vt_low). Curve 508 shows a normal distribution of the memory cells in an interim erase state where the threshold voltage of all of the bit cells is below the predetermined high threshold voltage and above the predetermined low threshold voltage. The values for the predetermined high and low threshold voltages can be based on the technology used to fabricate the memory cells. For curve 508, parallel FN erase continues within the cluster, while for failing cases represented for example by curves 504 or 506 or both, FN erase transitions to serial FN erase within the cluster.

By now it should be appreciated that systems and methods have been disclosed that adaptively adjust between using parallel and serial FN erase procedures for selected blocks of memory cells in an NVM array. In some embodiments, methods of performing an erase of a plurality of blocks (217, 219, 221, 223) of memory cells are disclosed. The memory cells within a block are simultaneously erased and the erase of each block of the plurality of blocks is performed using an erase pulse applied multiple times. The erase pulse can be applied to the plurality of blocks in parallel and performing an erase verify (406) after each application of the erase pulse. After a predetermined number applications of the erase pulse, the method can determine (418+420, 422+424) if a condition comprising one of a group consisting of any memory cell has been more erased than a first predetermined amount and any memory cell has been erased less than a second predetermined amount has been met. If the determining finds the condition has been met, the erasing can be continued by applying the erase pulse to the block having the memory cell with the condition independently (426) of the other blocks of the plurality of blocks.

In another aspect, the continue erasing can be further characterized by applying the erase pulse to each block independently of the other blocks.

In another aspect, the continue erasing can be performed serially (426) on the plurality of blocks.

In another aspect, the condition can comprise a memory cell having been erased more (418+420) than the first predetermined amount.

In another aspect, the condition can comprise a memory cell having been erased less (422+424) than the second predetermined amount.

In another aspect, the performing the erase can further comprise performing a soft program operation (314+316) after all of the memory cells have passed an erase verify.

In another aspect, the performing the soft program operation can ensure that all of the memory cells are erased between a predetermined minimum amount of erasing and a predetermined maximum amount of erasing.

In another aspect, the performing the erase can further comprise performing a pre-program operation (304+306) prior to applying the erase pulse.

In another aspect, the method can include performing an erase of a second plurality of blocks (308) of memory cells after performing the erase of the plurality of blocks. The erase pulse can be applied to the second plurality of blocks in parallel and an erase verify can be performed after each application of the erase pulse. After a predetermined number of applications of the erase pulse to the second plurality of blocks, the method can determine if a second condition comprising one of a group consisting of any memory cell in the second plurality of blocks has been more erased than a first predetermined amount and any memory cell in the second plurality of blocks has been erased less than a second predetermined amount has been met. If the second condition has been met, the erasing continues by applying the erase pulse to the block in the second plurality having the memory cell with the second condition independently of the other blocks in the second plurality of blocks.

In another aspect, the applying the erase pulse can be further characterized by the erase pulse having a predetermined voltage and duration.

In further embodiments, methods of performing an erase of a plurality of blocks (217, 219, 221, 223) of memory cells are provided. The memory cells within a block are simultaneously erased and the erase of each block of the plurality of blocks is performed using an erase pulse applied multiple times. The erase pulse (416) is applied to the plurality of blocks in parallel (402+404) and an erase verify (406) is performed after each application of the erase pulse. After a predetermined number applications of the erase pulse (412), the method can determine (418+420) if any memory cell has been more erased than a first predetermined amount. If a memory cell has been erased more than the first predetermined amount, the erasing can be continued by applying the erase pulse to the block having the memory cell that has been erased more than the first predetermined amount independently (426) of the other blocks of the plurality of blocks.

In another aspect, the method can further comprise, after the predetermined number applications of the erase pulse, determining if any memory cell has been erased less than a second predetermined amount. If a memory cell has been erased less (422+424) than the second predetermined amount, the erasing can continue by applying the erase pulse to the block having the memory cell that has been erased less than the second predetermined amount independently of the other blocks of the plurality of blocks.

In another aspect, the continue erasing by applying the erase pulse to the block having the memory cell that has been erased more than the first predetermined amount can be further characterized as applying the erase pulse to each block of the plurality of blocks independently (426) of the other blocks.

In another aspect, the continue erasing by applying the erase pulse to the block having the memory cell that has been erased less than the second predetermined amount can be further characterized as applying the erase pulse to each block of the plurality of blocks independently of the other blocks.

In another aspect, the method can further comprise continuing erasing by applying the erase pulse to the plurality of blocks in parallel (416) and performing an erase verify after each application of the erase pulse if none of the memory cells have a condition comprising one of a group consisting of having been erased less than the second predetermined amount and having been more erased than the first predetermined amount.

In still further embodiments, methods of performing an erase of a plurality of blocks (217, 219, 221, 213) of memory cells are disclosed. The memory cells within a block are simultaneously erased and the erase of each block of the plurality of blocks is performed using an erase pulse applied multiple times. The erase pulse (416) is applied to the plurality of blocks in parallel and an erase verify (406) is performed after each application of the erase pulse. After a predetermined number applications of the erase pulse, the method includes determining if any memory cell has been less erased than a first predetermined amount. If a memory cell has been erased less than the first predetermined amount, erasing is continued by applying the erase pulse (426) to the block having the memory cell that has been erased less than the first predetermined amount independently of the other blocks of the plurality of blocks.

In another aspect, the continue erasing by applying the erase pulse to the block having the memory cell that has been erased less than the first predetermined amount is further characterized as applying the erase pulse to each block (426) of the plurality of blocks independently of the other blocks.

In another aspect, the method can further comprise, after the predetermined number applications of the erase pulse, determining if any memory cell has been erased more than a second predetermined amount. If a memory cell has been erased more than the second predetermined amount (418+420), erasing is continued by applying the erase pulse to the block having the memory cell that has been erased more than the second predetermined amount independently of the other blocks of the plurality of blocks. The erase pulse (416) continues to be applied to the plurality of blocks in parallel and an erase verify performed after each application of the erase pulse if none of the memory cells have been erased more than the second predetermined amount or less than the second predetermined amount.

In another aspect, the method can further comprise performing pre-programming (304, 306) before applying the erase pulse and soft programming after erasing all of the memory cells have passed an erase verify.

In another aspect, the method can include performing an erase of a second plurality of blocks of memory cells after performing the erase of the plurality of memory cells including applying the erase pulse (416) to the second plurality of blocks in parallel. After a predetermined number (412) of applications of the erase pulse to the second plurality of blocks, the method can further include determining if a second condition comprising one of a group consisting of any memory cell in the second plurality has been more erased than a first predetermined amount and any memory cell in the second plurality has been erased less than a second predetermined amount has been met. If the determining finds the second condition has been met, erasing can continue by applying the erase pulse (416) to the block in the second plurality of blocks having the memory cell with the second condition independently (426) of the other blocks in the second plurality of blocks.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method of performing an erase of a plurality of blocks of memory cells, wherein the memory cells within a block are simultaneously erased and an erase of each block of the plurality of blocks is performed using an erase pulse applied multiple times, the method comprising:
    applying the erase pulse to the plurality of blocks in parallel and performing an erase verify after each application of the erase pulse;
    after a predetermined number applications of the erase pulse, determining if a condition comprising any memory cell has been more erased than a first predetermined amount; and
    if the determining finds the condition has been met, continue erasing by applying the erase pulse to the block having the memory cell with the condition independently of other blocks of the plurality of blocks.

2. The method of claim 1, wherein the continue erasing is further characterized by applying the erase pulse to each block independently of the other blocks.

3. The method of claim 2, wherein the continue erasing is performed serially on the plurality of blocks.

4. The method of claim 1, wherein the condition comprises a memory cell having been erased more than the first predetermined amount which is indicated by the cell having threshold voltage below a first predetermined limit.

5. The method of claim 1, wherein a second condition comprises a memory cell having been erased less than a second predetermined amount which is indicated by the cell having threshold voltage above a second predetermined limit.

6. The method of claim 1, wherein the performing the erase further comprises performing a soft program operation after all of the memory cells have passed an erase verify.

7. The method of claim 6, wherein the performing the soft program operation ensures that all of the memory cells are erased between a predetermined minimum amount of erasing and a predetermined maximum amount of erasing.

8. The method of claim 1, wherein the performing the erase further comprises performing a pre-program operation prior to applying the erase pulse.

9. The method of claim 1, wherein the method includes performing an erase of a second plurality of blocks of memory cells, further comprising:
    applying the erase pulse to the second plurality of blocks in parallel and performing an erase verify after each application of the erase pulse;
    after a predetermined number of applications of the erase pulse to the second plurality of blocks, determining if a second condition comprising one of a group consisting of any memory cell in the second plurality of blocks has been more erased than a first predetermined amount and any memory cell in the second plurality of blocks has been erased less than a second predetermined amount has been met; and if the determining finds the second condition has been met, continue erasing by applying the erase pulse to the block in the second plurality having the memory cell with the second condition independently of the other blocks in the second plurality of blocks.

10. The method of claim 9, wherein the applying the erase pulse is further characterized by the erase pulse having a predetermined voltage and duration.

11. A method of performing an erase of a plurality of blocks of memory cells, wherein the memory cells within a block are simultaneously erased and the erase of each block of the plurality of blocks is performed using an erase pulse applied multiple times, the method comprising:

applying the erase pulse to the plurality of blocks in parallel and performing an erase verify after each application of the erase pulse;

after a predetermined number applications of the erase pulse, determining if any memory cell has been more erased than a first predetermined amount; and if a memory cell has been erased more than the first predetermined amount, continue erasing by applying the erase pulse to the block having the memory cell that has been erased more than the first predetermined amount independently of the other blocks of the plurality of blocks.

12. The method of claim 11, further comprising:

after the predetermined number applications of the erase pulse, determining if any memory cell has been erased less than a second predetermined amount; and if a memory cell has been erased less than the second predetermined amount, continue erasing by applying the erase pulse to the block having the memory cell that has been erased less than the second predetermined amount independently of the other blocks of the plurality of blocks.

13. The method of claim 12, wherein the continue erasing by applying the erase pulse to the block having the memory cell that has been erased more than the first predetermined amount is further characterized as applying the erase pulse to each block of the plurality of blocks independently of the other blocks.

14. The method of claim 13, wherein the continue erasing by applying the erase pulse to the block having the memory cell that has been erased less than the second predetermined amount is further characterized as applying the erase pulse to each block of the plurality of blocks independently of the other blocks.

15. The method of claim 14, further comprising continuing erasing by applying the erase pulse to the plurality of blocks in parallel and performing an erase verify after each application of the erase pulse if none of the memory cells have a condition comprising one of a group consisting of having been erased less than the second predetermined amount and having been more erased than the first predetermined amount.

16. A method of performing an erase of a plurality of blocks of memory cells, wherein the memory cells within a block are simultaneously erased and the erase of each block of the plurality of blocks is performed using an erase pulse applied multiple times, the method comprising:

applying the erase pulse to the plurality of blocks in parallel and performing an erase verify after each application of the erase pulse;

after a predetermined number applications of the erase pulse, determining if any memory cell has been less erased than a first predetermined amount;

if a memory cell has been erased less than the first predetermined amount, continue erasing by applying the erase pulse to the block having the memory cell that has been erased less than the first predetermined amount independently of the other blocks of the plurality of blocks; and after the predetermined number applications of the erase pulse, determining if any memory cell has been erased more than a second predetermined amount;

if a memory cell has been erased more than the second predetermined amount, continue erasing by applying the erase pulse to the block having the memory cell that has been erased more than the second predetermined amount independently of the other blocks of the plurality of blocks; and continue applying the erase pulse to the plurality of blocks in parallel and performing an erase verify after each application of the erase pulse if none of the memory cells have been erased more than the second predetermined amount or less than the second predetermined amount.

17. The method of claim 16, wherein the continue erasing by applying the erase pulse to the block having the memory cell that has been erased less than the first predetermined amount is further characterized as applying the erase pulse to each block of the plurality of blocks independently of the other blocks.

18. The method of claim 16, further comprising performing pre-programming before applying the erase pulse and soft programming after erasing all of the memory cells have passed an erase verify.

19. The method of claim 16, wherein the method includes performing an erase of a second plurality of blocks of memory cells, further comprising:

applying the erase pulse to the second plurality of blocks in parallel;

after a predetermined number of applications of the erase pulse to the second plurality of blocks, determining if a second condition comprising one of a group consisting of any memory cell in the second plurality has been more erased than a first predetermined amount and any memory cell in the second plurality has been erased less than a second predetermined amount has been met; and if the determining finds the second condition has been met, continue erasing by applying the erase pulse to the block in the second plurality of blocks having the memory cell with the second condition independently of the other blocks in the second plurality of blocks.

* * * * *